United States Patent
Nitta et al.

(10) Patent No.: US 6,605,417 B2
(45) Date of Patent: Aug. 12, 2003

(54) METHOD FOR DECREASING SURFACE DEFECTS OF PATTERNED RESIST LAYER

(75) Inventors: Kazuyuki Nitta, Ebina (JP); Taku Nakao, Fujisawa (JP); Satoshi Maemori, Sagamihara (JP); Tatsuya Matsumi, Sagamihara (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/771,563

(22) Filed: Jan. 30, 2001

(65) Prior Publication Data

US 2001/0014431 A1 Aug. 16, 2001

(30) Foreign Application Priority Data

Feb. 4, 2000 (JP) ........................................ 2000-028328

(51) Int. Cl.$^7$ ................................................. G03F 7/00
(52) U.S. Cl. ....................................... 430/326; 430/322
(58) Field of Search ................................ 430/326, 322, 430/330, 331

(56) References Cited

U.S. PATENT DOCUMENTS 5,326,675 A * 7/1994 Niki ........................... 430/326
5,429,910 A 7/1995 Hanawa ....................... 430/313

FOREIGN PATENT DOCUMENTS

| JP | 7-175226 | 7/1995 |
| JP | 9-251210 | 9/1997 |
| JP | 11-145031 | 5/1999 |
| JP | 11-288105 | 10/1999 |

* cited by examiner

*Primary Examiner*—Kathleen Duda
(74) *Attorney, Agent, or Firm*—Wenderoth, Lind & Ponack, L.L.P.

(57) ABSTRACT

Disclosed is a method for decreasing the surface defects of a patterned photoresist layer on a substrate surface obtained by the procedure comprising the steps of (a) forming a photoresist layer of a positive-working chemical-amplification photoresist composition on the substrate surface, (b) patternwise exposing the photoresist layer to actinic rays, (c) subjecting the patternwise-exposed photoresist layer to a post-exposure baking treatment and (d) a development treatment. The improvement can be accomplished by bringing the photoresist layer after the post-exposure baking treatment into contact with an aqueous acidic solution having a pH of 3.5 or lower for 1 to 90 seconds. The acid contained in the aqueous acidic solution is preferably an aromatic sulfonic acid or, more preferably, a diphenyl ether sulfonic acid such as dodecyl(diphenyl ether)disulfonic acids.

10 Claims, No Drawings

METHOD FOR DECREASING SURFACE DEFECTS OF PATTERNED RESIST LAYER

BACKGROUND OF THE INVENTION

The present invention relates to a treatment method of a photoresist layer formed on a substrate surface by using a positive-working chemical-amplification photoresist composition for decreasing the surface defects in the patterned resist layer which can be detected by using a special inspection instrument.

Along with the trend in recent years in the field of semiconductor devices toward a higher and higher degree of integration, mass production of LSIs of a design rule 0.18 μm has already been industrialized and mass production of LSIs of the design rule 0.15 μm will shortly be on the start line.

While the process of photolithographic patterning of a photoresist layer on the substrate surface is undertaken in the manufacture of semiconductor devices, it is essential that the light for the patterning light exposure of the photoresist layer has a short wavelength in order to accomplish a high pattern resolution of the patterned resist layer. In this regard, the g-line light of 436 nm wavelength used in the early development stage of the photolithographic technology as the patterning exposure light was replaced with the i-line light of 365 nm wavelength which in turn has been replaced with the KrF excimer laser beams of 248 nm wavelength constituting the major current of the patterning exposure light in the modern photolithographic technology. Furthermore, ArF excimer laser beams of 193 nm wavelength are now expected to be the patterning exposure light of the coming generation and active development works are now under way for the photolithographic processes utilizing not only the KrF excimer laser beams but also the ArF excimer laser beams and photoresist materials suitable for use in the process utilizing these excimer laser beams.

As is well known, namely, the photoresist composition used as the major current in the early stage was the positive-working photoresist composition comprising a novolak resin as the resinous ingredient and a naphthoquinone diazidosulfonate ester compound as the photosensitive ingredient. Photoresist compositions of this type, however, could hardly comply with the technological requirements in the photolithographic patterning works using the KrF excimer laser beams or other light sources of further shorter wavelengths. This problem of the above mentioned photoresist compositions can be overcome by the use of so-called chemical-amplification photoresist compositions including the positive-working chemical-amplification ones, in which the alkali-solubility of the resinous ingredient in the light-exposed areas is increased by reacting with the acid generated from a radiation-sensitive acid-generating agent, and the negative-working chemical-amplification ones, in which the alkali-solubility of the resinous ingredient in the light-exposed areas is decreased by reacting with the acid generated from a radiation-sensitive acid-generating agent.

The requirements to be satisfied by the chemical-amplification photoresist compositions heretofore developed include high photosensitivity to the patterning exposure light, high pattern resolution and heat resistance of the patterned resist layer, focusing depth latitude, orthogonality of the cross sectional profile of the patterned resist layer and holding stability, i.e. the stability against degradation of the cross sectional profile of a patterned resist layer due to contamination with an amine compound and the like during standing between patternwise light exposure and post-exposure baking treatment of the resist layer as well as the substrate dependency which means adaptability of the photoresist composition to substrates having surface layers of different natures such as insulating materials, e.g., silicon nitride, semiconductor materials, e.g., polycrystalline silicon, and ceramic materials, e.g., titanium nitride. Namely, the cross sectional profile of the patterned resist layer is affected by the nature of the substrate surface on which the resist layer is formed.

In addition to the above mentioned various requirements, a recent technological issue relative to the performance of a chemical-amplification photoresist composition is the problem of surface defects which must be overcome in order to accomplish a high-quality patterned resist layer.

The above mentioned surface defect of a patterned resist layer is a disordered resist pattern such as infidelity of the resist pattern to the photomask pattern, deposition of scums or dust particles, short-circuiting between resist pattern lines and so on and is detectable by examining the patterned resist layer vertically from above with a special surface-defect detector (for example, Model KLA, manufactured by KLA Co.).

The yield of semiconductor devices is greatly decreased when the number of the above-mentioned surface defects is large and the semiconductor device cannot exhibit excellent performance even when the conventional requirements for the photoresist composition are satisfied. Thus, one of the important technological problems to be solved urgently in the manufacturing process of semiconductor devices is how to decrease the surface defects. Unless the problems of surface defects are solved, great difficulties would be encountered in the mass production of semiconductor devices.

The inventors previously could arrive at a success to reduce occurrence of such surface defects of patterned photoresist layers to some extent by modifying the formulation of the positive-working photoresist solutions. It is, however, a very desirable way in the photolithographic patterning technology if the problems of the surface defects could be solved effectively without such a modification of the formulation of the positive-working photoresist solutions.

SUMMARY OF THE INVENTION

The present invention accordingly has an object to provide a simple and convenient method for the surface treatment of a photoresist layer on the surface of a substrate formed by using a positive-working chemical-amplification photoresist composition in order to efficiently and reliably decrease the surface defects of the patterned resist layer without any modification of the formulation of the photoresist composition and the photolithographic processing conditions by using the photoresist composition.

Thus, the method of the present invention for decreasing the surface defects in a patterned resist layer comprises, in the photolithographic patterning process of a positive-working chemical-amplification photoresist layer on a substrate surface comprising the steps of forming a photoresist layer on the substrate surface, patternwise exposing the photoresist layer to actinic rays through a pattern-bearing photomask, subjecting the thus patternwise exposed photoresist layer to a post-exposure baking treatment and developing the photoresist layer after the post-exposure baking treatment with an aqueous alkaline developer solution, subjecting the photoresist layer after the post-exposure baking treatment to an acid treatment by bringing the photoresist layer into contact with an aqueous solution of an acid.

The above mentioned acid treatment of the photoresist layer is conducted by dipping the substrate bearing the photoresist layer in an aqueous acid solution or spray-coating or flow-coating of the photoresist layer with the aqueous acid solution. In this acid treatment, the photoresist layer is kept in contact with the aqueous acid solution preferably for a length of time in the range from 1 to 90 seconds.

DETAILED DESCRIPTION OF THE PREFERRED EMBODIMENTS

As is described above, the scope of the inventive method for decreasing surface defects of a patterned resist layer formed on a substrate surface consists in the additional step of an acid treatment of the photoresist layer after the post-exposure baking treatment but before the development treatment. Excepting for this additional step, the other steps of the photolithographic patterning procedure are just the same as in the conventional procedure utilizing a positive-working chemical-amplification photoresist composition.

The substrate material on which the photoresist layer is formed is typically a semiconductor silicon wafer. The photoresist composition to which the inventive method is applicable is a positive-working chemical-amplification photoresist composition comprising, as the essential ingredients, (A) a resinous compound substituted by acid-dissociable solubility-reducing groups for the hydroxyl groups of the resin and (B) a radiation-sensitive acid-generating agent. Besides the above mentioned two-component photoresist compositions, the method of the present invention is applicable also to a three-component positive-working chemical-amplification photoresist composition comprising an alkali-soluble resinous ingredient such as novolaks and polyhydroxystyrene resins, a low molecular-weight phenolic compound such as bisphenols and trisphenols substituted for the hydroxyl groups by tert-butyloxycarbonylmethyl groups as the acid-dissociable solubility-reducing groups, which can be dissociated by reacting with an acid to form free carboxyl groups resulting in an increase in the alkali-solubility of the compound, and a radiation-sensitive acid-generating agent.

The component (A) above mentioned is a compound having phenolic hydroxyl groups or carboxyl groups, of which the hydroxyl groups are substituted by acid-dissociable substituent groups capable of reducing the solubility of the resinous compound in an aqueous alkaline developer solution and capable of being dissociated by reacting with the acid generated in the patternwise exposure to actinic rays to increase the alkali-solubility of the compound. The component (A) is usually a polymeric resinous compound but can also be a low molecular-weight compound according to need.

The resinous compound as the component (A) is a homopolymer or copolymer such as a polyhydroxystyrene of which at least a part of the hydrogen atoms of the hydroxyl groups are substituted by acid-dissociable solubility-reducing groups exemplified by tert-butoxycarbonyl groups, tert-butyl groups, alkoxyalkyl groups such as ethoxyethyl and methoxypropyl groups and cyclic ether groups such as tetrahydropyranyl and tetrahydrofuranyl groups.

A particularly preferable resinous compound as the component (A) is a polyhydroxystyrene resin of which a part of the hydrogen atoms of the hydroxyl groups are substituted by substituent groups selected from the group consisting of tert-butoxycarbonyl, tert-butyl, alkoxyalkyl and cyclic ether groups. Particular examples of such a polyhydroxystyrene-based resinous compound include polyhydroxystyrenes of which 5 to 60% of the hydroxyl-hydrogen atoms are substituted by tert-butoxycarbonyl groups, polyhydroxystyrenes of which 5 to 60% of the hydroxyl-hydrogen atoms are substituted by tetrahydro-pyranyl groups, polyhydroxystyrenes of which 5 to 60% of the hydroxyl-hydrogen atoms are substituted by 1-ethoxyethyl groups, copolymers consisting of 10 to 49% by moles of hydroxystyrene units of which the hydroxyl-hydrogen atoms are substituted by tert-butoxycarbonyl groups, 10 to 49% by moles of hydroxystyrene units of which the hydroxyl-hydrogen atoms are substituted by 1-ethoxyethyl groups and 2 to 80% by moles of unsubstituted hydroxystyrene units, copolymers consisting of 10 to 49% by moles of hydroxystyrene units of which the hydroxyl-hydrogen atoms are substituted by tert-butyl groups, 10 to 49% by moles of hydroxystyrene units of which the hydroxyl-hydrogen atoms are substituted by 1-ethoxyethyl groups and 2 to 80% by moles of unsubstituted hydroxystyrene units, copolymers consisting of 10 to 49% by moles of hydroxystyrene units of which the hydroxyl-hydrogen atoms are substituted by tetrahydropyranyl groups, 10 to 49% by moles of hydroxystyrene units of which the hydroxyl-hydrogen atoms are substituted by 1-ethoxyethyl groups and 2 to 80% by moles of unsubstituted hydroxystyrene units and the like.

When the photoresist composition is to be used in the photolithographic patterning works with ArF excimer laser beams as the patternwise exposure light source, particularly preferable resinous compounds as the component (A) in the photoresist composition include those copolymers comprising the monomeric units of an acrylic acid ester of a polycyclic aliphatic hydrocarbon group and the monomeric units of an acrylate ester as the constituents of the main chain structure, such as copolymers of γ-butyrolacton-3-yl methacrylate and 2-methyladamantyl methacrylate, and resins having polycyclic aliphatic hydrocarbon groups containing acid-dissociable solubility-reducing groups such as the groups derived from tert-butyl ester of norbornene-5-carboxylic acid as the constituents of the main chain structure.

These resinous compounds can be used either singly or as a combination of two kinds or more according to need. It is preferable that the weight-average molecular weight of the resinous ingredient as the component (A) is in the range from 2000 to 50000 or, more preferably, from 5000 to 15000 assuming that the photoresist composition is of the two-component type although the applicability of the inventive method includes photoresist compositions of the three-component type as is mentioned before.

The component (B) as the other essential ingredient of the positive-working chemical-amplification photoresist composition used in combination with the component (A) is a radiation-sensitive acid-generating agent which releases an acid when irradiated with actinic rays. Various compounds known as an acid-generating agent in the chemical-amplification photoresist compositions of the prior art can be used here without particular limitations including diazomethane compounds, nitrobenzyl compounds, sulfonate ester compounds, onium salt compounds, benzoin tosylate compounds, halogen-containing triazine compounds, cyano group-containing oximesulfonate compounds and the like and particularly preferable among them are diazomethane compounds and onium salt compounds having a halogenoalkylsulfonic acid as the anion, of which the halogenoalkyl group has 1 to 15 carbon atoms.

Particular examples of the diazomethane compounds suitable for use here include bis(p-toluenesulfonyl) diazomethane, bis(1,1-dimethylethylsulfonyl) diazomethane, bis(cyclohexylsulfonyl)diazomethane and bis(2,4-dimethylphenylsulfonyl)diazomethane. Particular examples of the above mentioned onium salt compounds include diphenyliodonium trifluoromethane sulfonate, (4-methoxyphenyl)iodonium trifluoromethane sulfonate, bis(4-tert-butylphenyl)iodonium nonafluorobutane sulfonate, (4-methoxyphenyl)-diphenylsulfonium trifluoromethane sulfonate, (4-tert-butylphenyl)diphenylsulfonium trifluoromethane sulfonate and triphenylsulfonium nonafluorobutane sulfonate.

In the chemical-amplification photoresist composition to which the method of the present invention is applied, these radiation-sensitive acid-generating agents can be used either singly or as a combination of two kinds or more. The amount of the acid-generating agent as the component (B) in the photoresist composition is in the range from 0.5 to 30 parts by weight or, preferably, from 1 to 10 parts by weight per 100 parts by weight of the component (A). When the amount of the component (B) is too small, complete pattern formation can hardly be accomplished while, when the amount thereof is too large, the photoresist composition can hardly be obtained in the form of a uniform solution due to the limited solubility of the compound to cause a decrease in the storage stability of the photoresist solution, if it ever be obtained.

It is optional that the positive-working chemical-amplification photoresist composition to which the inventive method is applied is admixed with various known additives such as carboxylic acids, phosphorus-containing oxoacids, amine compounds and the like each in a limited amount. It is of course convenient that the photoresist composition is used in the form of a uniform solution prepared by dissolving the above-described essential and optional ingredients in an organic solvent. Examples of the organic solvents usable here include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol and dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more.

In applying the inventive method to a photoresist layer of a positive-working chemical-amplification photoresist composition, a photoresist layer formed on the surface of a substrate by using the photoresist solution is patternwise exposed to actinic rays such as KrF excimer laser beams through a pattern-bearing photomask followed by a post-exposure baking treatment (PEB). These treatments be conducted in substantially the same manner as in the photolithographic patterning works using a conventional positive-working chemical-amplification photoresist composition.

In the inventive method, the photoresist layer after the post-exposure baking treatment is subjected to an acid treatment so as to greatly decrease the surface defects in the patterned resist layer formed by a development treatment.

Namely, it is the inventors' presumption that the defects can be decreased as a consequence of removal of the alkali-insoluble matter on the surface after elimination of the acid-dissociable solubility-reducing groups in the component (A) found on the surface of the resist layer by the acid treatment to follow the post-exposure baking treatment since it is a due assumption that the alkali-insoluble matter in the photoresist composition is precipitated in the course of the water rinse after the alkali development treatment so as to be deposited on the surface of the patterned resist layer after the development treatment forming the defects.

It is therefore a requirement for the acid solution used in the above mentioned acid treatment that the acidity of the acid solution should be strong enough to cause dissociation of the acid-dissociable solubility-reducing groups in the component (A) of the photoresist composition. In other words, the acid treatment of the photoresist layer after the post-exposure baking treatment is continued for a sufficient length of time to cause acid-dissociation of the acid-dissociable solubility-reducing groups of the compound having hydroxyl groups substituted for the hydroxyl-hydrogen atoms by acid-dissociable solubility-reducing groups found on the surface of the photoresist layer.

In consideration of the acid-dissociability of the acid-dissociable solubility-reducing groups of the resinous compound in the conventional positive-working chemical-amplification photoresist compositions, the acidic aqueous solution used in the inventive acid treatment should have a value of pH not exceeding 3.5 or, preferably, in the range from 1.0 to 3.5. The concentration of the acid in the acidic aqueous solution for the acid treatment is in the range from 0.01 to 50 mass % or, preferably, from 0.1 to 10 mass %.

The acid to prepare the above mentioned acidic aqueous solution can be selected from the group consisting of inorganic acids such as hydrochloric and sulfuric acids and organic acids such as trifluoromethane sulfonic acid. In particular, it is sometimes advantageous that the acid is an organic acid having surface activity including fluorinated alkyl sulfonic acids such as perfluoroalkylbutyl sulfonic acids, perfluoroalkyloctyl sulfonic acids and perfluoroalkyldecyl sulfonic acids and salts thereof with a quaternary ammonium hydroxide, e.g., tetramethylammonium hydroxide and choline, or an alkanolamine, e.g., ethanolamine and diethanolamine. Among these acid compounds, non-volatile perfluoroalkyl sulfonic acids are preferred as being adaptable to the manufacturing lines of semiconductor devices and alkanolamine salts of a perfluoroalkyl sulfonic acid are preferable in respect of the easy controllability of the pH value of the aqueous solution.

In conducting a screening test for selecting an acid capable of giving the most remarkable result of the acid treatment, the inventors have come to an unexpected discovery that the method of the present invention can be accomplished successfully when the acidic aqueous solution for the acid treatment contains an aromatic sulfonic acid or carboxylic acid or, in particular, an aromatic sulfonic acid having two benzene nuclei or an naphthalene ring structure, or a sulfonic acid ester having a free acid group as derived from a metal salt of a sulfonate or sulfate ester by removing the metal cations.

Examples of suitable aromatic sulfonic and carboxylic acids include naphthalene carboxylic acids, naphthalene acetic acids, 1-naphthol-4-carboxylic acid, 1,8-naphthalene dicarboxylic acid, benzene disulfonic acids, 1,3,5-benzene trisulfonic acid, phenol sulfonic acid, phenol-2,4-disulfonic acid, cathecol-3,5-disulfonic acid, 2-nitrophenol-4-sulfonic acid, biphenyl sulfonic acid, naphthalene sulfonic acid, naphthol sulfonic acid, 2-naphthol-6,8-disulfonic acid, 2-naphthol-3,6-disulfonic acid, 4,5-dihydroxy-2,7-naphthalene sulfonic acid, 2,4-dinitro-1-naphthol-7-sulfonic acid.

Examples of the above mentioned sulfonate acids include alkyl benzene sulfonates having an alkyl group of at least 5 carbon atoms, alkyl naphthalene sulfonates having one or two of isopropyl, butyl or isobutyl groups, polycondensates of a naphthalene sulfonate and formaldehyde, polycondensates of a melamine sulfonate and formaldehyde, disalts of an alkyl sulfosuccinate, dialkyl sulfosuccinates, disalts of a polyoxyethylene alkyl sulfosuccinate, alkyl sulfoacetates, α-olefin sulfonates, sulfodimethyl isophthalate.

Examples of the above mentioned sulfate ester acids include higher alcohol sulfate esters, secondary higher alcohol sulfate esters, polyoxyethylene alkylether sulfates, secondary higher alcohol ethoxy sulfates and polyoxyethylene alkylphenol ether sulfates.

A more preferable aromatic acid is a diphenyl ether-based sulfonic acid represented by the general formula

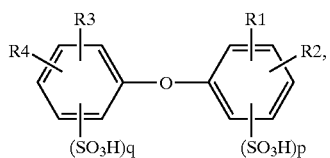

(I)

in which $R^1$, $R^2$, $R^3$ and $R^4$ are, each independently from the others, a hydrogen atom or an alkyl group having 5 to 20 carbon atoms with the proviso that at least one of the $R^1$, $R^2$, $R^3$ and $R^4$ is an alkyl group having 5 to 20 carbon atoms, and the subscripts p and q are, each independently from the other, 0, 1 or 2 with the proviso that p+q is not 0. Among the above defined diphenyl ether-based sulfonic acids, most preferable in respect of the possibility of decreasing the time for the acid treatment to 10 seconds or shorter are monoalkyl diphenyl ether disulfonic acids represented by the general formula

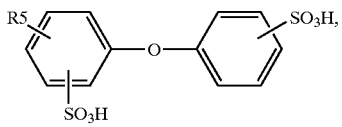

(II)

in which $R^5$ is an alkyl group having 5 to 20 carbon atoms.

It is important that the acid compound forming the acidic aqueous solution has little vaporizability at room temperature not to be lost by vaporization during the acid treatment. For example, such low vaporizability of the acid compound can be obtained when the acid compound has a molecular weight of at least 200 or in the range from 200 to 1000.

It is optional that the acidic aqueous solution of the above mentioned acid compound is admixed with a known surface active agent having no sulfonic acid group with an object to improve the wettability of the photoresist layer with the aqueous solution and to minimize the volume of the solution ejected from a dispenser nozzle. N-Octyl-2-pyrrolidone is an example of the surface active agent suitable for the purpose.

Although, as is mentioned above, the length of time for the acid treatment according to the invention must be long enough to completely dissociate the solubility-reducing groups of the resinous compound having the acid-dissociable solubility-reducing groups on the surface of the photoresist layer, the length of time should be as short as possible in consideration of the production throughput in the mass production of semiconductor devices. From the practical standpoint, the acid treatment is conducted for 1 to 90 seconds or, preferably, for 1 to 60 seconds. It is noted that the acid treatment of the photoresist layer after the post-exposure baking treatment has an effect of decreasing the contact angle of the aqueous alkaline developer solution to the surface of the photoresist layer.

The acid treatment according to the inventive method is a process in which the surface of the photoresist layer is brought into contact with the aqueous acidic solution by spraying the solution at the surface, by dipping the photoresist layer on the substrate in the solution or by application of the solution to the surface of the photoresist layer. In consideration of the requirement for a high production throughput, it is preferable in the manufacturing process of semiconductor devices that the aqueous acidic solution is applied to the surface of the photoresist layer, for example, by spin coating under ejection of the acid solution from a dispenser nozzle because no particular additional apparatuses are necessitated therefor.

The method of the present invention is applicable to the photoresist layers of positive-working chemical-amplification photoresist compositions of any types specifically formulated for the patterning light exposure by using KrF excimer laser beams, ArF excimer laser beams, $F_2$ excimer laser beams, X-rays and electron beams without particular limitations.

According to the method of the present invention, the acid treatment of the photoresist layer after the post-exposure baking treatment gives a very desirable result of greatly decreasing the surface defects of the photoresist layer after development. As a consequence of the trend in the manufacturing technology of semiconductor devices toward finer and finer patterning, the fineness of patterning of a photoresist layer is required to be 0.15 μm or even finer.

Such a requirement for an increase in the fineness of patterning can be complied with only with a resinous ingredient having hydroxyl groups substituted by acid-dissociable solubility-reducing groups as a base component in the positive-working chemical-amplification photoresist composition in an increased proportion of the hydroxyl-substituting solubility-reducing groups. As the proportion of the hydroxyl-substituting solubility-reducing groups is increased, however, the surface defects in the patterned photoresist layer are increased as a trend so that the increase in the proportion is naturally limited not to cause a difficulty in obtaining a patterned resist layer of high pattern resolution. By undertaking the method of the present invention, this problem of increased surface defects can be solved even with a formulation of the photoresist composition comprising a resinous ingredient of which the proportion of the hydroxyl-substituting solubility-reducing groups is increased so that a positive-working chemical-amplification photoresist composition capable of giving a far increased resolution of the patterned resist layer can be obtained.

In the following, the method of the present invention is described in more detail by way of Examples and Comparative Examples which, however, never limit the scope of the invention in any way.

EXAMPLE 1

A positive-working chemical-amplification photoresist solution was prepared by dissolving, in 500 parts by weight of propyleneglycol monomethyl ether acetate, 30 parts by weight of a first polyhydroxystyrene resin having a weight-average molecular weight of 10000, of which 40% of the hydroxyl-hydrogen atoms were substituted by tetrahydropyranyl groups, 70 parts by weight of a second polyhydroxystyrene resin having a weight-average molecular weight of 10000, of which 40% of the hydroxyl-hydrogen atoms were substituted by ethoxyethyl groups, 5 parts by weight of bis(cyclohexylsulfonyl)diazomethane, 1 part by weight of bis(4-tert-butylphenyl)iodonium trifluoromethane sulfonate, 0.1 part by weight of triethylamine and 0.5 part by weight of salicylic acid followed by filtration of the solution through a membrane filter of 0.2 µm pore diameter.

Separately, two acidic aqueous solutions 1 and 2 were prepared of which the solution 1 was prepared by dissolving 2 g of a perfluoroalkyloctyl sulfonic acid having a molecular weight of 500 in 100 g of water and had a pH of 1.7 and solution 2 was prepared by admixing the solution 1 with 0.051 g of N-octyl-2-pyrrolidone (Surfadone LP100, a product by ISP Japan Co.) and had a pH of 2.0.

A 6-inch semiconductor silicon wafer was spin-coated with the above prepared photoresist solution followed by heating at 90° C. for 90 seconds to give a dried photoresist layer having a film thickness of 0.7 µm. The photoresist layer was patternwise exposed to KrF excimer laser beams through a pattern-bearing photomask on a minifying projection light-exposure machine (Model FPA-3000EX3, manufactured by Canon Co.) followed by a post-exposure baking treatment at 90° C. for 90 seconds.

The whole surface of the photoresist layer after the post-exposure baking treatment was coated on a spinner for 30 seconds with one of the above-prepared acidic aqueous solutions 1 and 2 at room temperature ejected out of a dispenser nozzle. Thereafter, the photoresist layer was subjected to a development treatment with a 2.38 mass % aqueous solution of tetramethylammonium hydroxide as a developer solution at 23° C. for 60 seconds followed by rinse with water for 60 seconds.

Each of the thus obtained line-and-space patterned resist layers for the acidic aqueous solutions 1 and 2 was examined for the cross sectional profile on a scanning electron microscopic photograph to find good orthogonality. Further, the line-and-space patterned resist layers were examined for the 1:1 critical pattern resolution, photosensitivity, which was the minimum exposure dose which gave a line-and-space pattern of 0.25 µm line width, and the number of the surface defects to give the results that the critical resolution was 0.20 µm, the photosensitivity was 35 mJ/cm$^2$ and the number of surface defects was 1–5 for each of the acidic solutions 1 and 2. Counting of the surface defects in the resist layer was undertaken with a surface defect tester (Model KLA, manufactured by KLA Co.).

For comparison, a control experiment was undertaken in the same manner as above excepting for the omission of the acid treatment with the acidic aqueous solution. The results were that the critical resolution and the photosensitivity were as good as in the cases with the acid treatment while the number of the surface defects was as many as 10000.

EXAMPLE 2

Four acidic aqueous solutions 3 to 6 were prepared, of which the solution 3 having a pH of 2.0 was a 0.5 mass % aqueous solution of a dodecyl(diphenyl ether)disulfonic acid having a molecular weight of 498 and expressed by the formula

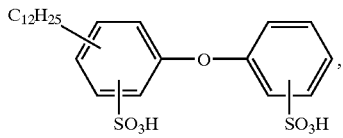

solution 4 having a pH of 1.82 was a 0.5 mass % aqueous solution of trifluoromethane sulfonic acid having a molecular weight of 150, solution 5 having a pH of 1.67 was a 1.0 mass % aqueous solution of trifluoromethane sulfonic acid and solution 6 having a pH of 1.9 was a 5.0 mass % aqueous solution of glycolic acid having a molecular weight of 76.

An acid treatment of a photoresist layer after the post-exposure baking treatment was undertaken in substantially the same manner as in Example 1 by using one of the above prepared acidic aqueous solutions 3 to 6 except that the length of time for the acid treatment was 10 seconds instead of 30 seconds.

The results obtained in these four experiments were that the cross sectional profile of the patterned resist layer, critical resolution and photosensitivity were each as good as in Example 1 while the number of the surface defects was 0–5 with the solution 3 and 10000 with each of the solutions 4 to 6.

What is claimed is:

1. In a method for the preparation of a patterned photoresist layer on a substrate surface comprising the steps of (a) forming a layer of a positive-working chemical-amplification photoresist composition on the substrate surface, (b) patternwise exposing the photoresist layer to actinic rays, (c) subjecting the patternwise light-exposed photoresist layer to a post-exposure baking treatment and (d) subjecting the photoresist layer after the post-exposure baking treatment to a development treatment with an aqueous alkaline developer solution, the improvement which comprises bringing the photoresist layer after the post-exposure baking treatment in step (c), prior to the development treatment in step (d), into contact with an aqueous acidic solution containing an aromatic sulfonic acid having two benzene nuclei or a naphthalene ring structure.

2. The improvement as claimed in claim 1 in which the aqueous acidic solution has a pH of 3.5 or lower.

3. The improvement as claimed in claim 1 in which the concentration of the acid in the aqueous acidic solution is in the range from 0.01 to 50 mass %.

4. The improvement as claimed in claim 1 in which the aromatic sulfonic acid contained in the aqueous acidic solution is a diphenyl ether sulfonic acid represented by the general formula

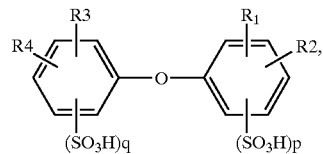

in which each of $R^1$, $R^2$, $R^3$ and $R^4$ is, independently from the others, a hydrogen atom or an alkyl group having 5 to 20 carbon atoms with the proviso that at least one of $R^1$, $R^2$, $R^3$ and $R^4$ is an alkyl group having 5 to 20 carbon atoms and each of the subscripts p and q is, independently from the other, 0, 1 or 2 with the proviso that p+q is a positive integer.

5. The improvement as claimed in claim 4 in which the diphenyl ether sulfonic acid is a dodecyl(diphenyl ether) disulfonic acid.

6. The improvement as claimed in claim 1 in which the photoresist layer is brought into contact with the aqueous acidic solution by ejecting the solution at the photoresist layer.

7. The improvement as claimed in claim 1 in which the photoresist layer is kept in contact with the aqueous acidic solution for a length of time in the range from 1 to 90 seconds at room temperature.

8. The improvement as claimed in claim 1 in which the aqueous acidic solution contains a surface active agent.

9. The improvement as claimed in claim 8 in which the surface active agent is N-octyl-2-pyrrolidone.

10. The improvement as claimed in claim 1 in which the acid contained in the aqueous acidic solution is an organic acid having fluorinated alkyl sulfonic acids.

* * * * *